(12) United States Patent
Kwon et al.

(10) Patent No.: US 8,242,686 B2
(45) Date of Patent: Aug. 14, 2012

(54) ORGANIC LIGHT EMITTING DISPLAY AND FABRICATING METHOD THEREOF

(75) Inventors: Oh-June Kwon, Yongin (KR);
Kwan-Hee Lee, Yongin (KR);
Seung-Yong Song, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 58 days.

(21) Appl. No.: 12/621,481

(22) Filed: Nov. 18, 2009

(65) Prior Publication Data
US 2011/0006671 A1   Jan. 13, 2011

(30) Foreign Application Priority Data
Jul. 10, 2009   (KR) ................. 10-2009-0063094

(51) Int. Cl.
*H01J 1/62*   (2006.01)

(52) U.S. Cl. ........... 313/504; 313/506; 313/512; 445/25

(58) Field of Classification Search .......... 313/498–512; 445/24, 25
See application file for complete search history.

(56) References Cited

U.S. PATENT DOCUMENTS
6,143,189 A * 11/2000 Glueck et al. .................. 216/23
2003/0218422 A1* 11/2003 Park et al. ..................... 313/512

FOREIGN PATENT DOCUMENTS
| JP | 2001-044141 | 2/2001 |
| JP | 2004-307318 | 11/2004 |
| JP | 2005-219960 | 8/2005 |
| KR | 1020060073331 A | 6/2006 |
| KR | 100711882 B1 | 4/2007 |

* cited by examiner

*Primary Examiner* — Bumsuk Won
(74) *Attorney, Agent, or Firm* — Christie, Parker & Hale, LLP

(57) ABSTRACT

An organic light emitting display is formed with a plurality of display panels that are cut and separated from a mother substrate to form a unit display panel. Here, the substrate has a groove on its outer surface to improve the deformation strength of the cutting surface and to protect the strength of the panel from being degraded by improving the quality of the cutting cross-section. The organic light emitting display includes: a first substrate formed with a plurality of display panels partitioned by a cutting line and having a first groove on its outer surface corresponding to the cutting line; and a second substrate overlapped with an upper part of the first substrate and having a second groove on its outer surface corresponding to the cutting line, wherein the first and second grooves are formed with cutting positions lower than that of the outer surfaces of the respective substrates.

7 Claims, 3 Drawing Sheets

ORGANIC LIGHT EMITTING DISPLAY AND FABRICATING METHOD THEREOF

CROSS-REFERENCE TO RELATED APPLICATION

This application claims priority to and the benefit of Korean Patent Application No. 10-2009-0063094, filed on Jul. 10, 2009, in the Korean Intellectual Property Office, the entire content of which is incorporated herein by reference.

BACKGROUND OF THE INVENTION

1. Field of the Invention

Embodiment relates to an organic light emitting display, and more particularly, to an organic light emitting display that can perform a cutting process by forming grooves on the outer surface of a substrate on which a cutting line is formed, and a fabricating method thereof.

2. Description of Related Art

An organic light emitting display is a type of organic semiconductor device that has been widely applied due to its relatively simple structure. The organic light emitting display, which is a self-emission type display element using an organic layer as an emission layer, does not require a separate backlight for light emission as it is required for a liquid crystal display, and thus the thickness of the organic light emitting display can be made thinner than a comparable liquid crystal display, and the weight of the organic light emitting display can be made lighter than the comparable liquid crystal display. Therefore, the organic light emitting display has now been actively developed as a display panel for a portable information terminal such as a mobile computer, a portable telephone, a portable game apparatus, an electronic book, etc.

An organic light emitting display device has a structure in which at least one organic layer including an emission layer is interposed between a pair of electrodes, that is, a first electrode and a second electrode. The first electrode is formed on a substrate and functions as an anode that injects holes, wherein an organic layer is formed on the upper part of the first electrode. The second electrode that functions as a cathode that injects electrons is formed on the organic layer to be opposed to the first electrode.

For mass production, the organic light emitting display described above is manufactured by a sheet unit display panel (or mother substrate), that is, manufactured with a plurality of display panels all at one time (rather than manufacturing a unit display panel one at a time) and then the sheet unit display panel is cut to thereby produce each unit display panel.

When cutting the sheet unit display panel in the related art into the unit display panel, the surfaces of both substrates of the display panel are scratched with a scriber, and the scratch is transferred into the inside thereof for cutting.

However, a glass substrate that is used in the display panel may be relatively large and the strength thereof may be relatively high, thereby causing a difficulty in generating cracks on the surface of the substrate.

In other words, since the strength of the surface of the substrate is high due to the improvement of material, etc., a cut region where the scribing is performed is applied with a strong stress, thereby generating a weak point of the substrate.

Assuming that the breaking down of the weak point of the substrate is generated on the cutting cross-section, the force applied to the cross-section is generated as the deformation against external stress, wherein the magnitude of the external stress is largest on the surface of the substrate.

Consequently, when cutting the unit display panel according to the method of the related art, the cutting cross-section of the surface of the substrate where the scribing is performed becomes the weakest and thus, the cutting crack may become irregularly propagated so that the cutting cross-section of the substrate is irregularly formed, thereby degrading the strength of the unit panel.

SUMMARY OF THE INVENTION

An aspect of an embodiment of the present invention is directed toward an organic light emitting display that, when cutting a mother substrate formed with a plurality of display panels into a unit display panel, forms grooves on respective outer surfaces of the substrate on which the cutting line is formed at a certain or predetermined depth to improve the deformation strength of the cutting surface and to prevent or protect the strength of the panel from being degraded by improving the quality of the cutting cross-section, and a fabricating method thereof.

According to an embodiment of the present invention, there is provided an organic light emitting display including: a first substrate; a plurality of display panels on the first substrate and partitioned by a cutting line, the first substrate having a first groove on its outer surface corresponding to the cutting line; and a second substrate overlapping with an upper part of the first substrate and having a second groove on its outer surface corresponding to the cutting line. Here, the first groove has a cutting portion at a position lower than that of the outer surface of the first substrate, and the second groove has a cutting portion at a position lower than that of the outer surface of the second substrate.

In one embodiment, the first and second grooves are formed to have a depth of 20% to 80% of the thickness of the first and second substrates, respectively.

In one embodiment, each of the display panels includes a pixel region on which an organic light emitting element is formed and a non-pixel region formed at peripheries of the pixel region, the organic light emitting element including a first electrode, an organic layer, and a second electrode. The organic light emitting display may further include sealants between the first substrate and the second substrate. Here, the sealants may be formed at and along the peripheries of the pixel regions of the respective display panels, and the first and second substrates may be bonded to each other by the sealants.

According to another embodiment of the present invention, there is provided a fabricating method of an organic light emitting display including: preparing a first substrate with a plurality of display panels formed thereon, the plurality of display panels being partitioned by a cutting line; disposing a second substrate to overlap an upper part of the first substrate; forming a first grove on an outer surface of the first substrate to correspond to the cutting line; forming a second grove on an outer surface of the second substrate to correspond to the cutting line; forming sealants along peripheral parts of the respective display panels at regions between the first and second substrates; bonding the first substrate to the second substrate with the sealants; and cutting regions at where the first and second grooves are formed and separating the respective display panels from each other.

Herein, the first and second grooves are formed through an etching process and/or a polishing process.

With the embodiments as described above, the grooves having a certain or predetermined depth are formed on the respective outer surfaces of the substrates to correspond with the cutting line to improve the impact and deformation strength of the cutting surface and to prevent or protect the strength of the panel from being degraded by improving the quality of the cutting cross-section.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
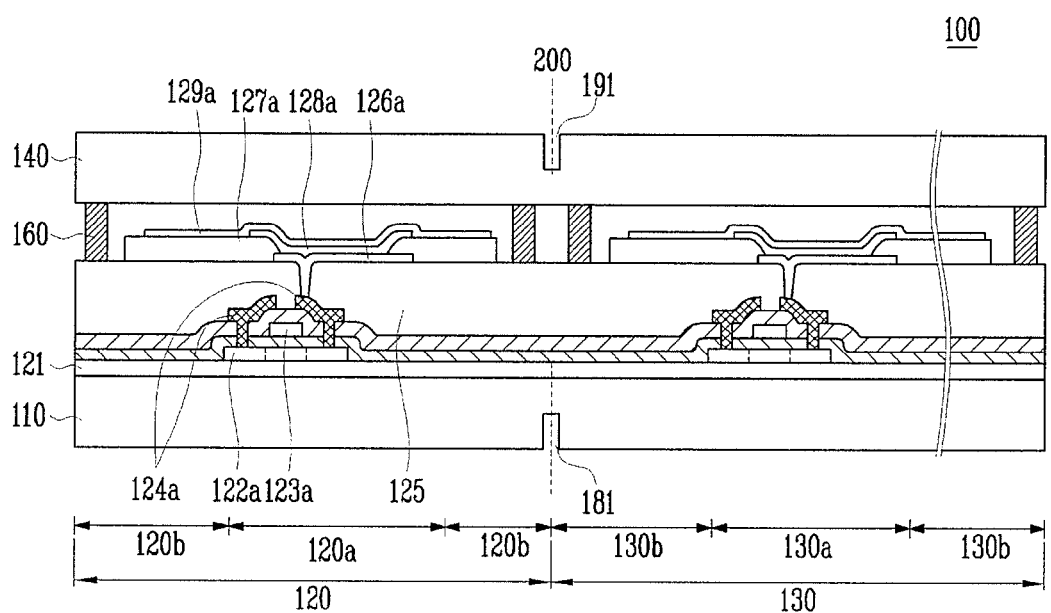
FIG. 1 is a schematic cross-sectional view of an organic light emitting display according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, exemplary embodiments according to the present invention will be described with reference to the accompanying drawings.

FIG. 1 is a schematic cross-sectional view of an organic light emitting display according to an embodiment of the present invention.

Here, FIG. 1 shows a state where a plurality of organic light emitting displays as unit display panels are formed and are not cut.

Referring to FIG. 1, between a display panel 120 and a display panel 130, grooves 181 and 191 are formed on the outer surfaces of both substrates 110 and 140 that constitute the display panels, respectively; and the respective display panels 120 and 130 are later cut as unit display panels based on the regions where the grooves 181 and 191 are formed.

The respective display panels 120 and 130 include a first substrate 110, a second substrate 140, and sealants. The first substrate 110 is configured with pixel regions 120a and 130a (where an organic light emitting element including a first electrode 126a, an organic layer 128a, and a second electrode 129a are formed), and non-pixel regions 120b and 130b, and has a first groove 181 formed on the outer surface of the region between the display panels 120 and 130. The second substrate 140 is positioned on the upper part of the first substrate 110 and has a second groove 191 formed on the outer surface corresponding to the first groove 181. The sealants are provided between the first substrate 110 and the second substrate 140 and are formed along the peripheral parts of the respective pixel regions 120a and 130a, wherein the first substrate 110 is bonded to the second substrate 140 by the plurality of sealants 160.

Hereinafter, for convenience of explanation, two specific display panels of a plurality of display panels, that are continuously arranged, will be referred to as the first display panel 120 and the second display panel 130.

Here, the first substrate 110 is used to form the first display panel 120 that includes the first pixel region 120a and the first non-pixel region 120b, and to form the second display panel 130 that is arranged continuously with the first display panel 120 and includes a second pixel region 130a and a second non-pixel region 130b. In the context of the present embodiment, the pixel regions 120a and 130a are referred to as regions on which an image is displayed, and the non-pixel regions 120b and 130b are referred to as regions other than the pixel regions. Also, the second display panel 130 has parts substantially the same as that of the first display panel 120 so that the detailed description thereof will not be provided again.

A buffer layer 121 is formed on the first substrate 110. The buffer layer 121, which is a selective constituent, is formed using a nitride film, an oxide film, etc. A thin film transistor is formed on the buffer layer 121. The thin film transistor includes a semiconductor layer 122a, a gate electrode 123a, and a source/drain electrode 124a. The semiconductor layer 122a is formed on the buffer layer 122a, in a certain or predetermined pattern. A gate insulating layer is formed on the semiconductor layer 122a, and a gate electrode 123a in a certain or predetermined pattern is formed on one region of the gate insulating layer. An interlayer insulating layer is formed on the gate electrode 123a, and the source/drain electrode 124a is formed on the certain or predetermined region of the interlayer insulating layer. A planarization layer 125 is formed on the source/drain electrode 124a and the interlayer insulating layer.

The first electrode 126a is formed on one region of the planarization layer 125. Here, the first electrode 126a is coupled electrically to the source/drain electrode 124a through a via hole. A pixel defining layer 127a including an opening portion exposing at least one region of the first electrode 126a is formed on the first electrode 126a. The emission layer 128a is formed on the opening portion of the pixel defining layer 127a, and the second electrode layer 129a is formed on the emission layer 128a and the pixel defining layer 127a.

The sealant 160 is provided between the non-pixel region of the first substrate 110 and the second substrate 140 to bond the first substrate 110 to the second substrate 140.

The second substrate 140 is bonded to the first substrate 110 by the sealant 160. The second substrate 140 is bonded to the first substrate 110 by the sealant 160, and certain or predetermined inclusions (or parts) are provided between the first and second substrates 110 and 140. Here, the sealant 160 is proved to protect the inclusions (or parts) formed on the first substrate 110 from external oxygen, hydrogen and moisture.

In addition, the respective grooves 181 and 191 are formed on the outer surfaces of the first substrate 110 and the second substrate 140, that is, on the outer surfaces of the substrates 110 and 140 to form a cutting line 200 defined on the interface between the non-pixel region 120b of the first display panel 120 and the non-pixel region 130b of the second display panel 130, respectively.

In one embodiment, the respective grooves 181 and 191 are formed to have a depth corresponding to a half of the thickness of the first and second substrates 110 and 140.

In other words, in the embodiment of the present invention, portions where the cutting of the substrates is performed, that is, the grooves 181 and 191, are formed on the outer surfaces of the substrates so that the cutting of the substrates is performed on positions lower than the height of the outer surfaces of the respective substrates. Therethrough, the cause resulting in the breakdown of the substrate by thinning the thickness of the substrates in the portions to be cut is removed and the thickness of the substrates with the exception of the portions where the grooves 181 and 191 are formed is able to be constantly maintained, making it possible to maintain the strength of the substrates.

Figure 2:
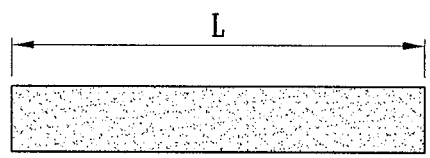
FIG. 2 is a schematic diagram explaining the function of the groove of FIG. 1.
Figure 2:
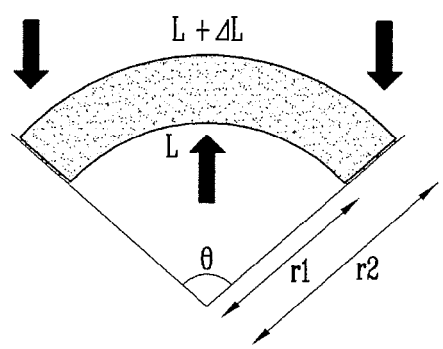

More specifically, Young's modulus is represented by displacement variation for force applied vertically to a unit surface, wherein referring to FIG. 2, assuming that there is no change in the length L of the inner surface of the normal substrate when the limiting curvature of the substrate for the vertically applied force is $\theta$, and the thickness of the substrate is $t(t=r2-r1)$, $L+\Delta L=r2*\theta$ and $L=r1*\theta$ so that $\Delta L=\theta*(r2-r1)=\theta*t$.

In other words, the limiting curvature is in inverse proportion to the thickness (t) of the substrate, and $\Delta L$ should be minimized in order to increase the limiting curvature, consequently a large limiting curvature can result as the thickness of the substrate is thinner.

Here, the feature that the limiting curvature is large means that the extent to which the substrate can be bent is large, such that the thickness of the portions where the cutting is performed becomes thin by lowering the weakest portions at where the substrates are cut (that is, the cross-sections) to be lower than the substrate surfaces to thereby enlarge the deformation strength of the cutting cross-sections, making it possible to improve the quality of the cutting cross-sections.

Therefore, with the embodiment of the present invention, the cross-sections are implemented to be lower than the substrate surfaces through the grooves 181 and 191 formed on the outer surfaces of the respective substrates 110 and 140 corresponding to the cutting line 200, making it possible to improve the deformation strength of the cutting cross-sections and the quality of the cutting cross-sections.

In particular, the grooves 181 and 191 of the embodiment of the present invention are shown to be formed on the outer surfaces of the respective substrates where the cutting is performed. In another embodiment, when the grooves are formed on the inner surfaces of the substrates, the surfaces where the actual cutting is performed is performed at the same height as the substrate surfaces, thereby making it possible to implement the aforementioned effects.

In other words, the embodiment of the present invention is characterized in that the grooves 181 and 191 are formed on the outer surfaces of the substrates where the cutting is performed to be cut at portions lower than the substrate surfaces at the time of performing the cutting process. Here, in one embodiment, the depth of the grooves 181 and 191 is implemented to be a half of the thickness of the substrate.

FIGS. 3A to 3F are process flow schematic cross-sectional views of a fabricating method of an organic light emitting display according to an embodiment of the present invention.

Figure 3A:
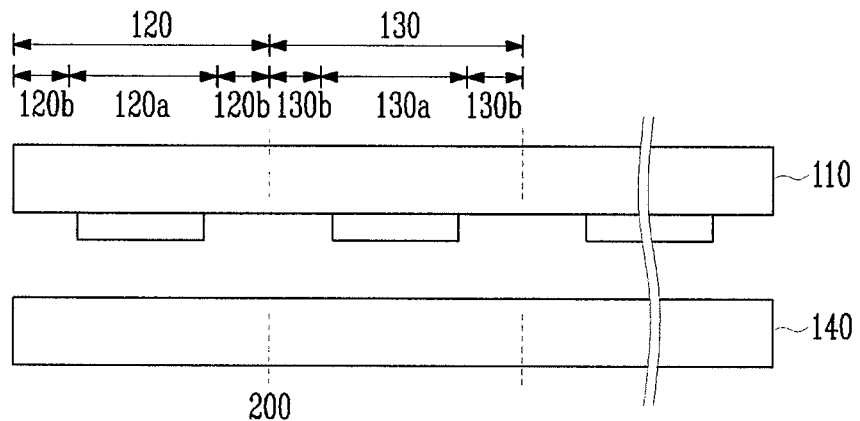
FIGS. 3A to 3F are process flow schematic cross-sectional views of a fabricating method of an organic light emitting display according to an embodiment of the present invention.

Referring to FIG. 3A, on the first substrate 110, the first display panel 120 and the second display panel 130 are formed. Here, the first display panel 120 includes the first pixel region 120a and the first non-pixel region 120b, and the second display panel 130 is arranged continuously with the first display panel 120 and includes the second pixel region 130a and the second non-pixel region 130b. The cutting line 200 is positioned on outer surfaces of the substrate corresponding to the first and second non-pixel regions 120b and 130b of the first and second substrates 110 and 140.

Figure 3B:
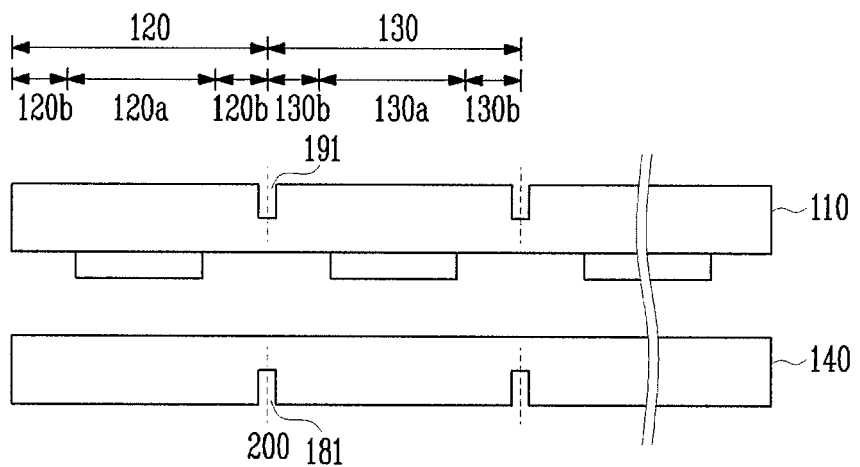

Thereafter, referring to FIG. 3B, the first groove 181 and the second groove 191 are formed on the outer surfaces of the first substrate 110 and the second substrate 140, corresponding to the cutting line 200, respectively.

The patterns of the grooves 181 and 191 are formed through an etching process and/or a polishing process. The depth of the grooves 181 and 191 is formed to have a height of 20% to 80% of the thickness of the first and second substrates 110 and 140, wherein the height of the grooves 181 and 191 is limited to a range that does not degrade the strength of the first and second substrates 110 and 140 where the respective grooves are formed.

Figure 3C:
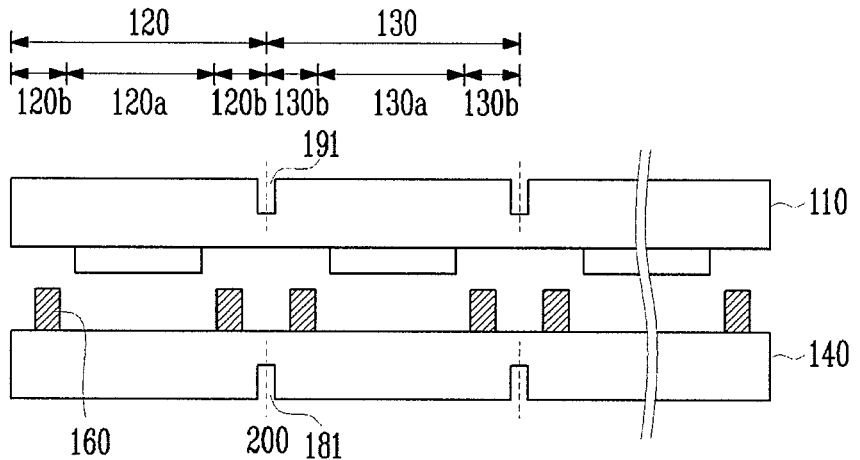

Next, referring to FIG. 3C, sealants 160 are coated on the second substrate 140 corresponding to the non-pixel regions 120b and 130b so that the respective regions 120a and 130a formed on the first substrate 110 are at least sealed on the inner surface of the second substrate 140.

Figure 3D:
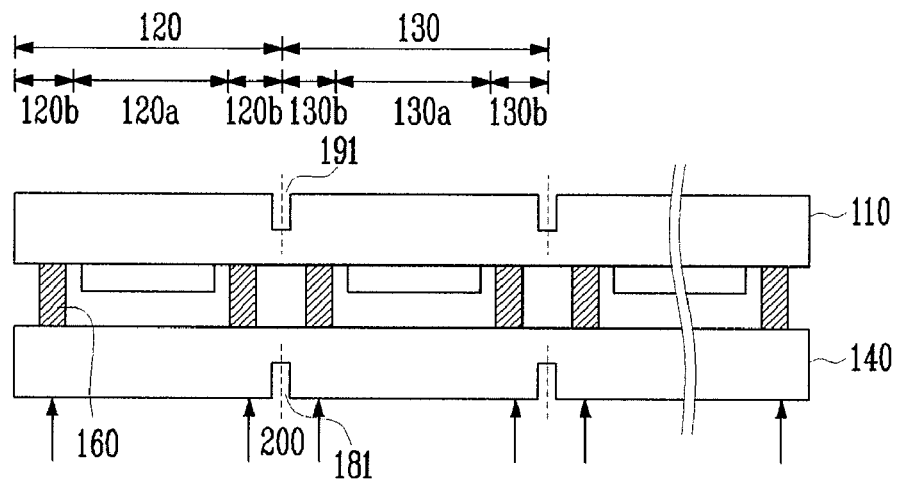

Next, referring to FIG. 3D, the first substrate 110 is bonded to the second substrate 140, and the sealants 160 are melted by emitting laser or infrared rays that are emitted thereon, thereby bonding the first substrate 110 to the second substrate 140.

Figure 3E:
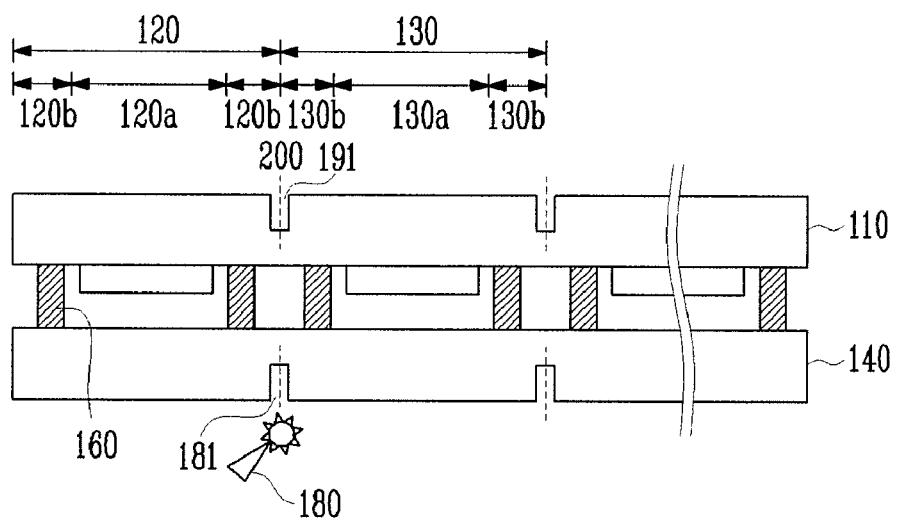

Thereafter, referring to FIG. 3E, a cutting process is performed using a cutting apparatus 180 so that the first substrate 110 and the second substrate 140 bonded to each other are separated into unit display panels. Here, the cutting line 200 is referred to as an interface between the non-pixel region 120b of the first display panel 120 and the non-pixel region 130b of the second display panel 130, and first and second grooves 181 and 191 are positioned on the outer surfaces of the respective substrates corresponding to the cutting line, respectively.

Figure 3F:
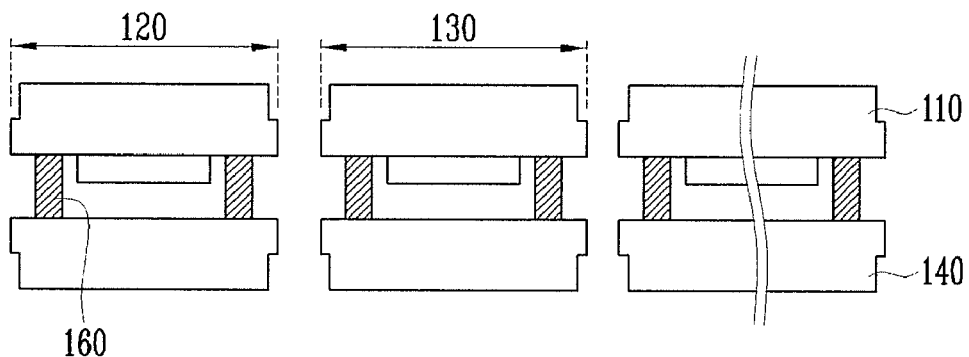

Finally, referring to FIG. 3F, a plurality of display panels are manufactured as unit display panels 120 and 130 using the aforementioned method.

Here, in the cases of the respective display panels, as shown in the drawing, the end portions of the first and second substrates 110 and 140 are implemented in a shape where their outer surfaces are bent at the first and second grooves 181 and 191.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
a first substrate;
a plurality of display panels on the first substrate and partitioned by a cutting line, the first substrate having a first etched groove on its outer surface corresponding to the cutting line, the first etched groove having a depth of 20% to 80% of a thickness of the first substrate; and
a second substrate overlapping with an upper part of the first substrate and having a second etched groove on its outer surface corresponding to the cutting line, the second etched groove having a depth of 20% to 80% of a thickness of the second substrate,
wherein the first etched groove has a cutting portion at a position lower than that of the outer surface of the first substrate, and the second etched groove has a cutting portion at a position lower than that of the outer surface of the second substrate.

2. The organic light emitting display as claimed in claim 1, wherein each of the display panels comprises a pixel region on which an organic light emitting element is formed and a non-pixel region formed at peripheries of the pixel region, the organic light emitting element comprising a first electrode, an organic layer, and a second electrode.

3. The organic light emitting display as claimed in claim 2, further comprising:
sealants between the first substrate and the second substrate, the sealants being formed at and along the peripheries of the pixel regions of the respective display panels, wherein the first and second substrates are bonded to each other by the sealants.

4. The organic light emitting display as claimed in claim 2, further comprising:
sealants between the first substrate and the second substrate, the sealants being formed on the non-pixel regions of the respective display panels, wherein the first and second substrates are bonded to each other by the sealants.

5. A fabricating method of an organic light emitting display, the method comprising:
preparing a first substrate with a plurality of display panels formed thereon, the plurality of display panels being partitioned by a cutting line;
disposing a second substrate to overlap an upper part of the first substrate;
forming a first groove on an outer surface of the first substrate to correspond to the cutting line;
forming a second groove on an outer surface of the second substrate to correspond to the cutting line;
forming sealants along peripheral parts of the respective display panels at regions between the first and second substrates;
bonding the first substrate to the second substrate with the sealants; and
cutting regions at where the first and second grooves are formed and separating the respective display panels from each other,
wherein the first and second grooves are formed through an etching process,
wherein the first groove is formed to have a depth of 20% to 80% of the thickness of the first substrate, and the second groove is formed to have a depth of 20% to 80% of the thickness of the second substrate, and
wherein the first etched groove has a cutting portion at a position lower than that of the outer surface of the first substrate, and the second etched groove has a cutting portion at a position lower than that of the outer surface of the second substrate.

6. The fabricating method of the organic light emitting display according to claim 5, wherein the first and second grooves are further formed through a polishing process.

7. An organic light emitting display comprising:
a first substrate;
a first display panel and a second display panel, the first and second display panels being on the first substrate and partitioned by a cutting line, the first substrate having a first etched groove on its outer surface corresponding to the cutting line, the first etched groove having a depth of 20% to 80% of a thickness of the first substrate; and
a second substrate overlapping with an upper part of the first substrate and having a second etched groove on its outer surface corresponding to the cutting line, the second etched groove having a depth of 20% to 80% of a thickness of the second substrate,
wherein the first etched groove has a cutting portion at a position lower than that of the outer surface of the first substrate, and the second etched groove has a cutting portion at a position lower than that of the outer surface of the second substrate.

* * * * *